(12) United States Patent
Voutilainen et al.

(10) Patent No.: US 8,461,567 B2
(45) Date of Patent: Jun. 11, 2013

(54) APPARATUS AND METHOD FOR SENSING PHOTONS

(75) Inventors: Martti Voutilainen, Espoo (FI); Markku Rouvala, Helsinki (FI); Pirjo Pasanen, Helsinki (FI)

(73) Assignee: Nokia Corporation, Espoo (FI)

( * ) Notice: Subject to any disclaimer, the term of this patent is extended or adjusted under 35 U.S.C. 154(b) by 294 days.

(21) Appl. No.: 12/822,892

(22) Filed: Jun. 24, 2010

(65) Prior Publication Data
US 2011/0315949 A1 Dec. 29, 2011

(51) Int. Cl.
*H01L 27/14* (2006.01)

(52) U.S. Cl.
USPC .................................. 257/9; 257/431; 438/70

(58) Field of Classification Search
USPC ....... 257/9, E31.032, E31.127, 432; 427/162; 204/192.26; 438/70
See application file for complete search history.

(56) References Cited

U.S. PATENT DOCUMENTS

| | | | |
|---|---|---|---|
| 4,438,455 A | 3/1984 | Tabei | |
| 6,297,071 B1 * | 10/2001 | Wake | 438/70 |
| 6,727,487 B2 * | 4/2004 | Yamaguchi et al. | 250/208.1 |
| 2004/0259010 A1 * | 12/2004 | Kanbe | 430/67 |
| 2009/0200584 A1 * | 8/2009 | Tweet et al. | 257/292 |
| 2009/0200626 A1 * | 8/2009 | Qian et al. | 257/432 |
| 2009/0294759 A1 * | 12/2009 | Woo et al. | 257/29 |
| 2010/0132771 A1 | 6/2010 | Lu | |
| 2011/0042650 A1 | 2/2011 | Avouris et al. | |

OTHER PUBLICATIONS

Ryzhii, V. et al., "Terahertz and infrared photodetection using p-i-n multiple-graphene-layer structures", Journal of Applied Physics 107, 054512, 2010.*
Lee, E. J. H., et al., "Contact and edge effects in graphene devices", Nature Nanotechnology, pp. 1-5, Published online: Jun. 29, 2008.
Xia, F. et al., "Ultrafast graphene photodetector", Nature Nanotechnolgy, vol. 4, pp. 839-843, Dec. 2009, (Published online: Oct. 11, 2009).
Xia, F. et al., "Discussion on the internal and external quantum efficiency of graphene photodetectors", Nature Nanotechnology, Supplementary Information, pp. 1-3, 2009.
Park, J. et al., "Imaging of Photocurrent Generation and Collection in Single-Layer Graphene", Nano Letters, vol. 9, No. 5, pp. 1742-1746, 2009.
Fyson, J. R. et al., Fabrication of a Patterned Interference Filter Array Deposited by an Atmospheric Pressure Vapour Deposition Technique, e-Journal of Surface Science and Nanotechnology, vol. 7, pp. 284-289, 2009.
Ryzhii, M. et al., "Electrically-induced n-i-p junctions in multiple graphene layer structures", 7 pages, Feb. 9, 2010.
Volkel, R. et al., "Miniaturized imaging systems", Microelectronic Engineering 67-68, Elsevier Science B.V., pp. 461-472, 2003.

(Continued)

*Primary Examiner* — Steven Loke
*Assistant Examiner* — Sitaramarao S Yechuri
(74) *Attorney, Agent, or Firm* — Locke Lord LLP

(57) ABSTRACT

In accordance with an example embodiment of the present invention, an apparatus is provided, including a plurality of photon sensing layers arranged on top of each other, and an intermediate layer between each two adjacent sensing layers, the sensing layers being of graphene, and each intermediate layer being configured to prevent a respective color component of light from proceeding into the photon sensing layer next to it.

18 Claims, 4 Drawing Sheets

OTHER PUBLICATIONS

Xia, F. et al., "Photocurrent imaging and efficient photon detection in a graphene transistor", Nano Letters, vol. 9, No. 3, pp. 1039-1044, 2009.

Xia, F. et al., "Photocurrent imaging and efficient photon detection in a graphene transistor", 22 pages.

Xia, F. et al., Supporting information for "photocurrent imaging and efficient photon detection in a graphene transistor", 2 pages.

Duparre, J. et al., "Artificial compound eyes—different concepts and their application to ultra flat image acquisition sensors", Proceedings of the International Society for Optical Engineering, MOEMS and Miniaturized Systems IV, vol. 5346, pp. 89-100, Jan. 27-28, 2004.

Duparre, J. et al. "Artificial compound eyes—different concepts and their application to ultra-flat image acquisition sensors", 12 pages.

Ryzhii, V. et al, "Terahertz and infrared photodetection using p-i-n multiple-graphene-layer structures", Journal of Applied Physics 107, 054512, 2010, 7 pages.

International Search Report of International Application No. PCT/FI2011/050482—Date of Completion of Search: Oct. 3, 2011, 5 pages.

\* cited by examiner

APPARATUS AND METHOD FOR SENSING PHOTONS

TECHNICAL FIELD

The present application relates generally to apparatuses and methods for sensing photons.

BACKGROUND

An image sensor is an apparatus that converts an optical image into an electric signal. It has been widely used in digital cameras and other imaging devices, such as camera-equipped mobile phones. Most digital cameras use either a CMOS (Complementary Metal-Oxide Semiconductor) sensor or a CCD (Charge Coupled Device) sensor.

SUMMARY

Various aspects of examples of the invention are set out in the claims.

According to a first aspect of the invention there is provided an apparatus, comprising:
a plurality of photon sensing layers arranged on top of each other; and
an intermediate layer between each two adjacent sensing layers, the sensing layers being of graphene, and each intermediate layer being configured to prevent a respective color component of light from proceeding into the photon sensing layer next to it.

In an example embodiment, the light refers to visible light, infrared light and/or ultraviolet light. And a color component refers to a respective color component.

In an example embodiment, the plurality of photon sensing layers arranged on top of each other provides a layered structure. A stack of layers may be formed. In such a stack major surfaces of the sensing layers and intermediate layers may face each other. They may be in contact with each other.

In an example embodiment, reflective coatings present examples of intermediate layers.

In an example embodiment, there is provided a camera sensor based on graphene photo detectors. In an example embodiment a graphene transistor is used to detect photons. The detector may be integrated to a camera sensor system which functions similarly as a CMOS sensor, or like a CCD sensor, or similar. In an example embodiment, it has been observed that the photon detection ability of graphene can be used to separate different wavelengths with the use of suitable intermediate filtering layers, and the structure can be used as a camera sensor.

In an example embodiment, a single pixel camera sensor is provided. Each of the required color components of a color picture are obtained by a single pixel cell (or photocell). In an example embodiment, the sensor comprises graphene layers and reflective or absorbing coatings that separate different color components. In an example embodiment, the combination of graphene layers and reflective or absorbing layers is used to measure different wavelength bands with a single photocell.

In an example embodiment, properly biased graphene transistor's capability to detect visible light combined with the use of reflecting and anti-reflecting coatings is used:
- to produce a black and white image directly to be used in MPEG4 compressed format for luminance information, and/or
- to produce red, green and blue colors used in RGB-coded color system.

This all can be implemented in one single photocell comprising of several graphene layers and reflective (or absorbing) coatings.

In an example embodiment, the apparatus comprises the intermediate layer(s) configured to prevent a predetermined color component from proceeding via reflection of the color component.

In an example embodiment, the apparatus comprises the intermediate layer(s) configured to prevent a predetermined color component from proceeding via absorption of the color component.

In an example embodiment, at least one of the plurality of photon sensing layers comprises a plurality of graphene sub-layers or sheets. In other words, one or more of the graphene layers comprise more than one graphene sheet (sub-layer) on top of each other.

In an example embodiment, the apparatus is selected from the group consisting of: an image sensor for a black and white image system, and an image sensor of a color image system, such as an RGB-coded system. In an example embodiment, a single pixel RBG sensor is provided.

In an example embodiment, the apparatus comprises the following layers on top of each other in the following order: a sensing layer for a first color, a reflective layer or an absorbing layer for the first color, a sensing layer for a second color, a reflective layer or an absorbing layer for the second color, and a sensing layer for a third color.

In an example embodiment, the first color is blue, the second color is green, and the third color is red. In other embodiments, the order of the sensing layers (and respective reflective or absorbing layers) may be different.

In an example embodiment, the apparatus comprises an anti-reflective coating or layer on top of the sensing layer of the first color.

In an example embodiment, a sensor pixel in the apparatus is covered by a respective microlens.

In an example embodiment, the apparatus is a handheld mobile communication device, such as a mobile phone. In an example embodiment, the apparatus is a digital camera. In certain embodiments, the apparatus is a digital storage camera, mobile phone camera, a security camera, or an embedded camera structure.

According to a second aspect of the invention there is provided a method, comprising:
providing a plurality of photon sensing layers arranged on top of each other; and an intermediate layer between each two adjacent sensing layers, the sensing layers being of graphene; and
preventing by each intermediate layer a respective color component of light from proceeding into the photon sensing layer next to it.

In an example embodiment, the method comprises:
preventing by each intermediate layer a respective color component from proceeding into the photon sensing layer next to it via reflecting the color component.

In an example embodiment, the method comprises:
preventing by each intermediate layer a respective color component from proceeding into the photon sensing layer next to it via absorbing the color component.

In an example embodiment, the method comprises:
providing at least one of the plurality of photon sensing layers with a plurality of graphene sub-layers or sheets.

In an example embodiment, the method comprises:
providing an apparatus for sensing color components in the apparatus, the apparatus being selected from the group consisting of: an image sensor for a black and white image system, and an image sensor of a color image system, such as an RGB-coded system.

In an example embodiment, the method comprises: manufacturing said photon sensing layers and said intermediate layer(s) by a manufacturing method which is selected from a group consisting of: an atomic layer deposition method, a chemical vapor deposition method, a spin coating method, and an RF sputtering method.

In an example embodiment, the method comprises: manufacturing a stacked structure comprising layers on top of each other, where the layers are in the following order: a sensing layer for a first color, a reflective layer or an absorbing layer for the first color, a sensing layer for a second color, a reflective layer or an absorbing layer for the second color, and a sensing layer for a third color. A color may mean a color component. The first color/color component may be blue, the second one green, and the third one red. In other embodiments, the order of the sensing layers (and respective reflective or absorbing layers) may be different.

In an example embodiment, the method comprises manufacturing an anti-reflective coating or layer on top of the sensing layer of the first color.

In an example embodiment, the method comprises covering a sensor pixel by a respective microlens.

Different non-binding example aspects and embodiments of the present invention have been illustrated in the foregoing. The above embodiments are used merely to explain selected aspects or steps that may be utilized in implementations of the present invention. Some embodiments may be presented only with reference to certain example aspects of the invention. It should be appreciated that corresponding embodiments may apply to other example aspects as well. Any appropriate combinations of the embodiments may be formed.

BRIEF DESCRIPTION OF THE DRAWINGS

For a more complete understanding of example embodiments of the present invention, reference is now made to the following descriptions taken in connection with the accompanying drawings in which.

DETAILED DESCRIPTION

Example embodiments of the present invention and their potential advantages are understood by referring to FIGS. 1 through 10 of the drawings. In the following description, like numbers denote like elements.

Graphene absorbs photons effectively in visible, infrared and ultraviolet frequencies. The use of graphene as a photon detector is based on the observation that graphene absorbs light very evenly in the whole visible light spectrum. A graphene photo detector may be integrated to a camera sensor system which functions similarly as a CMOS sensor, or like a CCD sensor, or similar.

Figure 1:
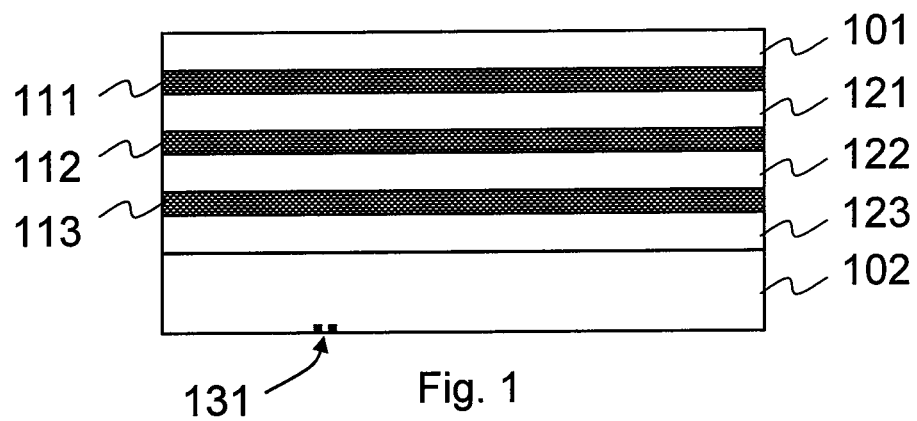
FIG. 1 shows a photon sensing structure in accordance with an example embodiment of the invention.

FIG. 1 shows a photon sensing structure in accordance with an example embodiment of the invention. On the top the structure comprises an anti-reflective coating 101 for all color components. Below that layer the structure comprises a first sensing layer 111 made of graphene.

Below layer 111 the structure comprises a reflective coating or layer 121 for a first color component (hereinafter referred to as the first reflective coating 121). The first reflective coating 121 passes other color components, but reflects the first color component. In this embodiment, the first color component is blue. Below the first reflective coating 121 the structure comprises a second sensing layer 112 made of graphene.

Below layer 112 the structure comprises a reflective coating or layer 122 for a second color component (hereinafter referred to as the second reflective coating 122). The second reflective coating 122 passes other color components, but reflects the second color component. In this embodiment, the second color component is green. Below the second reflective coating 122 the structure comprises a third sensing layer 113 made of graphene.

Below layer 113 the structure optionally comprises a reflective coating 123 for a third color component (the third reflective coating 123). In this embodiment, the third color component is red. It should be noted however, that the order of the color filters (layers 121-123) can be chosen to be different from the one presented above.

On the bottom, there is a layer 102 comprising amplifiers, logic, and wires to form a pixel structure known as such. The wires are depicted by the wires 131 in FIG. 1. In an alternative embodiment, the logic etc. can be placed to the edges of a pixel cell.

As to the photon sensing operation in the current embodiment it is noted that practically all incoming photons (or incoming light) enter the first sensing layer 111. The blue color component is then practically obtained by subtracting signals obtained from the second and third sensing layers 112-113 from the signal obtained from the first sensing layer 111. Correspondingly, since all color components except the blue color component enter the second sensing layer 112, the green color component is obtained by subtracting the signal obtained from the third sensing layer 113 from the signal obtained from the second sensing layer 112. And, the red color component is directly obtained from the signal obtained from the third sensing layer 113.

In the event only a black and white picture is desired, the first sensing layer 111 can be used to obtain the black and white picture, in other words luminance information or similar without computing.

Furthermore, the concept can be used also in other frequencies such as infrared and ultraviolet.

Figure 2:
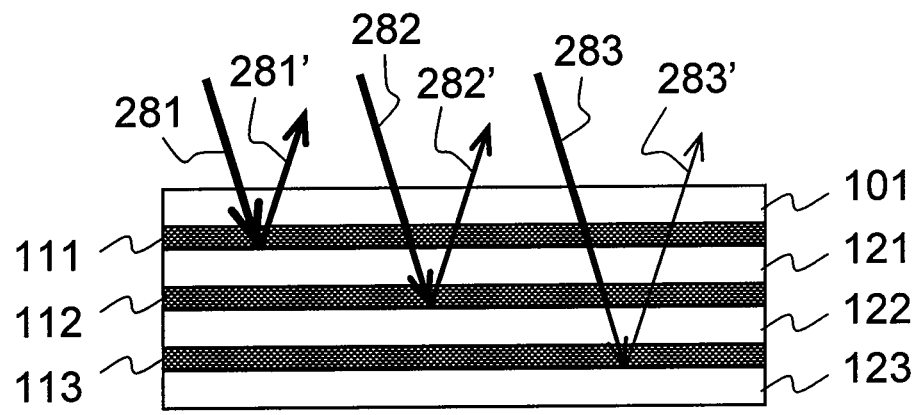
FIG. 2 shows reflections in the structure in accordance with an example embodiment of the invention.

FIG. 2 shows reflections in the structure of FIG. 1 in accordance with an example embodiment.

A desired number of graphene sheets can be fabricated on top of each other. In an example embodiment, the number of graphene sheets in the first sensing layer 111 is four, the number of graphene sheets in the second sensing layer 112 is four, and the number of graphene sheets in the third sensing layer 113 is ten. The number of graphene sheets in each layer, however, can be varied to optimize the performance. Each graphene sheet typically absorbs around 2.3% of the incoming photons for each color component.

A suitable fabrication method for graphene sheets is for example the CVD (Chemical Vapor Deposition) method. Alternatively, any other suitable method can be used. A fabricated graphene sheet can be used as a substrate upon which the next graphene sheet can be deposited.

Color separation between different color components is determined by the quality of the reflector layers (reflective coatings 121-123) and can be achieved by suitably choosing the thicknesses and reflection coefficients of the reflective coatings 121-123.

The wavelength (color) of the light reflected from a multi-layer for a given angle of incidence $\theta_1$ can be calculated from Snell's law:

$$n_1 \cdot \sin\theta_1 = n_2 \cdot \sin\theta_2$$

where $n_1$ and $n_2$ are refraction indices of media, and $\theta_2$ is the angle of refraction. For any reflection, the reflected wavelength $\lambda$ can be calculated from:

$$\lambda = 2 \cdot (n_1 \cdot d_1 \cdot \cos\theta_1 + n_2 \cdot d_2 \cdot \cos\theta_2)$$

where $d_1$ and $d_2$ are the thicknesses of media.

When $n_1 \cdot d_1 \cdot \cos\theta_1 = n_2 \cdot d_2 \cdot \cos\theta_2$, then $\lambda = 4 \cdot n_1 \cdot d_1 \cdot \cos\theta_1$, which gives the maximum reflection. There will then be constructive interference for that wavelength.

In an example embodiment, the thicknesses and reflection coefficients of media are chosen so that there will be constructive interference for the reflected light at desired wavelengths, and transmission for other wavelengths. The materials and thicknesses used in the reflective coatings 121-123 depend on the implementation. In certain embodiments, the thickness of the second reflective (green) coating 122, for example, can be around 300 nm.

Certain examples of applicable reflective coatings are $TiO_2$, and ZnO layers, and thin film polymer layers, such as layers of polystyrene or teflons. Alternatively, nanoparticle based adsorption materials may be used. Suitable methods of fabricating are, for example, spin coating, the ALD (Atomic Layer Deposition) method, and RF sputtering.

In the embodiment presented in FIG. 2, the first reflective coating 121 reflects from the incoming light 181 the wavelength range of the blue color component 181'. The second reflective coating 122 reflects from the incoming light 182 (from which the first reflective coating 121 has reflected the blue color component already) the wavelength range of the green color component 182'. And, the optional third reflective coating 123 reflects from the incoming light 183 (from which the first and second reflective coatings 121 and 122 have reflected the blue and green color components already) the wavelength range of the red color component 183'. The use of the reflective coatings 121-123 basically double the light detection efficiency since then also the back reflected signals can be used.

Figure 3:
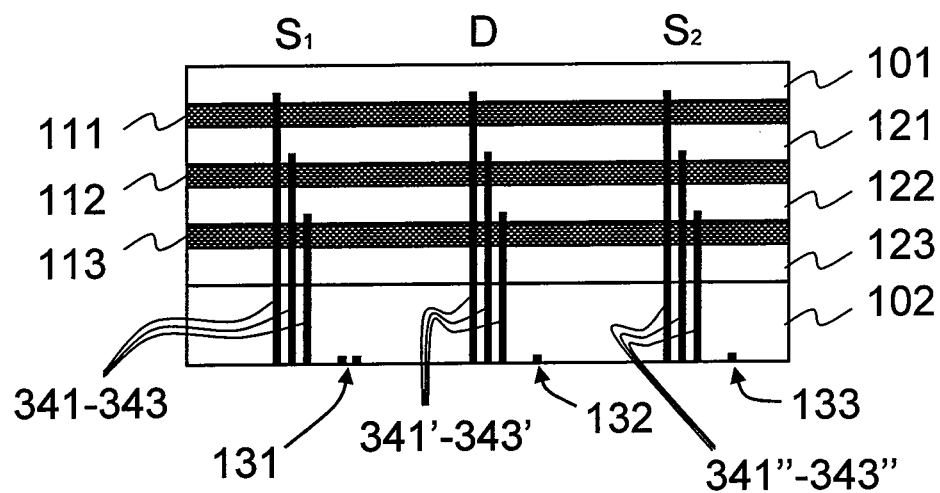
FIG. 3 shows a side view of the structure in accordance with an example embodiment of the invention.

FIG. 3 shows a side view of the structure in accordance with an example embodiment of the invention. The structure covers one pixel cell. The size of the pixel cell may be for example 1 μm×1 μm. For example, for a 12M sensor there could then be 3000×4000 such pixel cells arranged in an array. The pixel cell shown in FIG. 3 comprises two source electrodes $S_1$, $S_2$, and one drain electrode D. In an embodiment, the contacts 341-343, 341'-343' and 341"-343" to each graphene layer 111-113 are made of metal. As mentioned in the foregoing, the layer 102 comprises amplifiers, logic, and wires to form a pixel structure. The wires are depicted by the wires 131-133 in FIG. 3.

Figure 4:
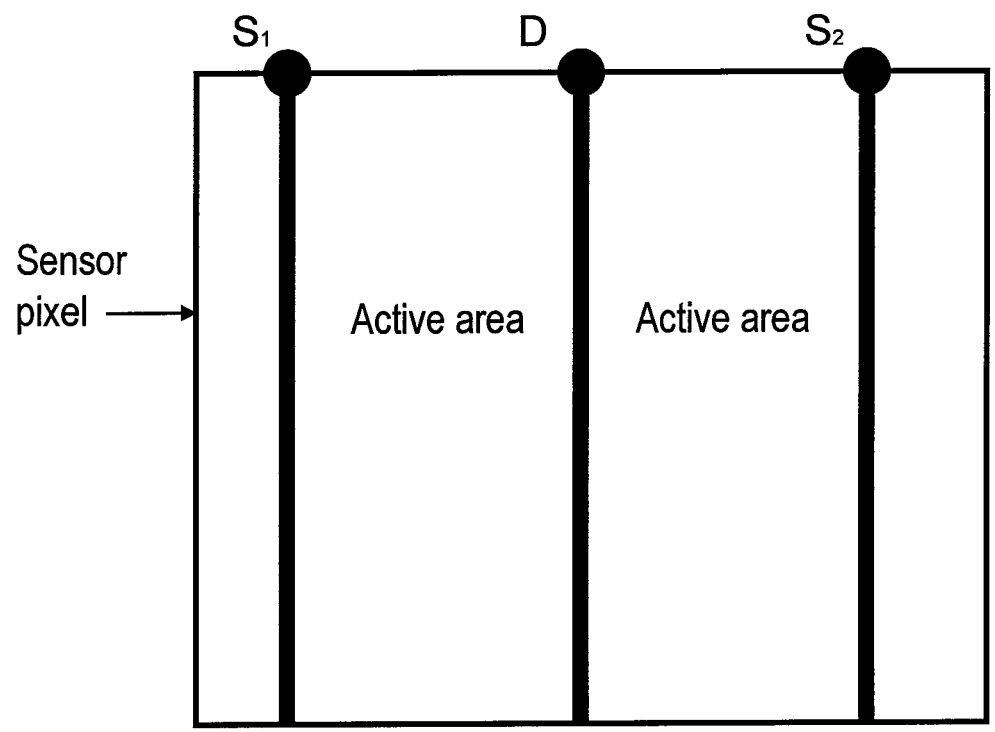
FIG. 4 shows a top view of a pixel cell in accordance with an example embodiment of the invention.

FIG. 4 shows a top view of a pixel cell in accordance with an example embodiment of the invention. Shows are the electrodes $S_1$, D, and $S_2$ of a graphene transistor. In the embodiment shown in FIG. 4 the electrodes are straight electrodes.

The efficiency of conversion of photons to current can be optimized by tuning the geometry and structure of the pixel cell, for example by the following:
 making the channels between electrodes short and wide; and/or
 making a plurality of source and drain electrodes in same pixel cell.

The noise level in the sensor can be reduced by making the pixel cells smaller.

Figure 5:
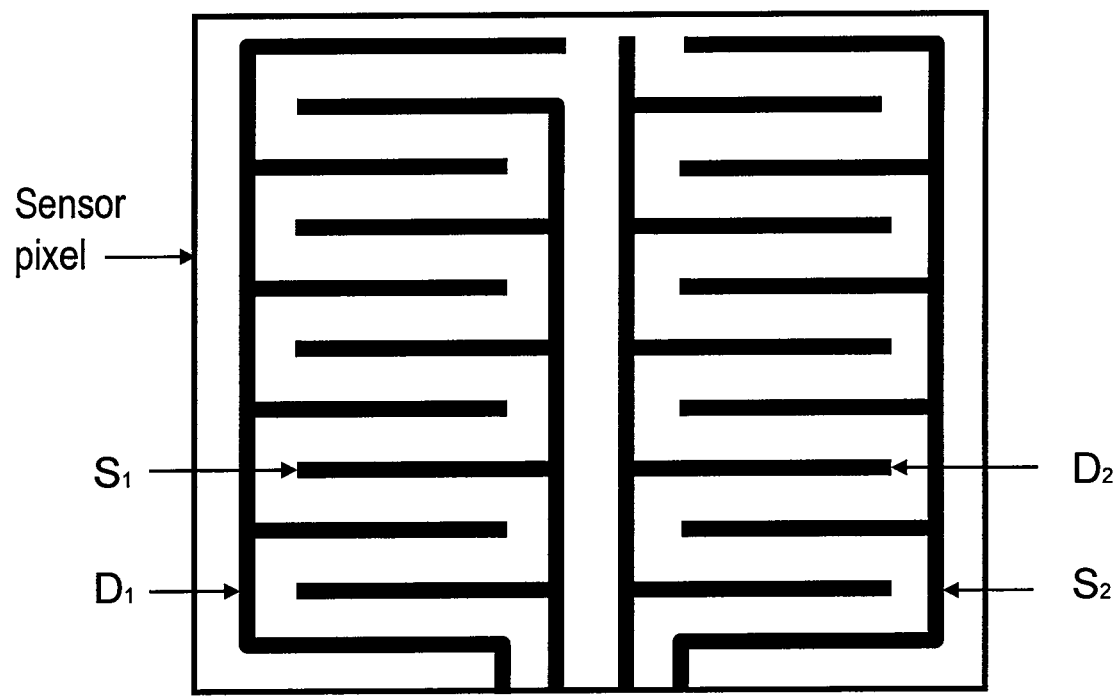
FIG. 5 shows an alternative top view of a pixel cell in accordance with an example embodiment of the invention.

FIG. 5 shows an alternative top view of a pixel in accordance with an example embodiment of the invention. In this embodiment, the source and drain electrodes $S_1$, $S_2$, $D_1$ and $D_2$ are formed as an interdigitated pattern to efficiently cover the pixel area.

In an example embodiment, the sensor may be properly biased by doping effects of the electrodes in such a way that external biasing is not needed ("zero-bias operation"). In practice, it is possible to practically eliminate a leakage current by using zero or very small source-drain voltage. Then, the potential difference generated by a doping effect of the source and drain metal contacts is used to drive the photon generated electrons and holes to source and drain electrodes for further amplification.

Figure 6:
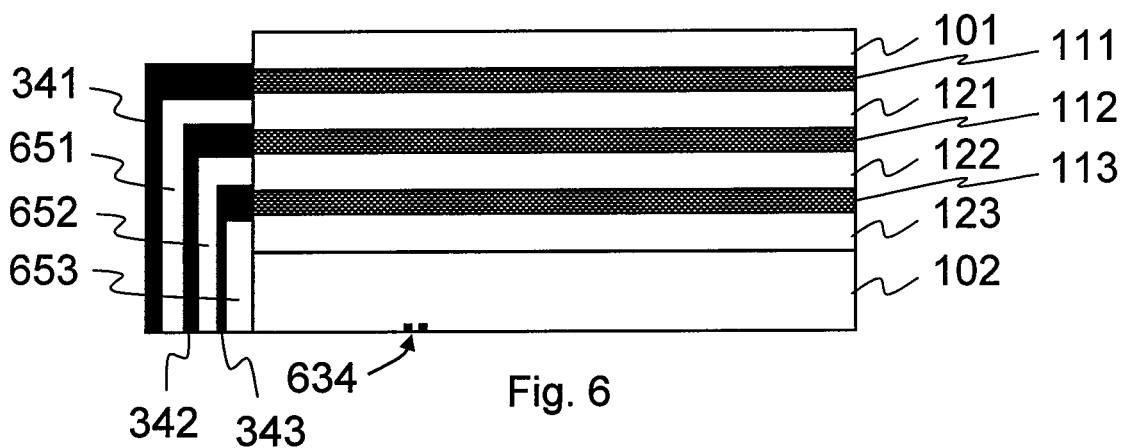
FIG. 6 shows contacts in accordance with an example embodiment of the invention.

FIG. 6 shows contacts in accordance with an example embodiment of the invention. The contacts 341-343 to each layer's source and drain metal electrodes are on the edges of the pixel. The contacts 341-343 can be fabricated layer by layer by deposition of metal and dielectric 651-653. In more detail, the contacts 341-343 to each graphene layer 111-113 can be fabricated by depositing first a metal layer, etching it to desired shape, then dielectric, etching it; and continuing after all three contacts have been fabricated. Visible in FIG. 6 are also the wires 634 at layer 102. Although not shown in FIG. 6, the wires 634 typically should have a connection to the respective contacts.

Figure 7:
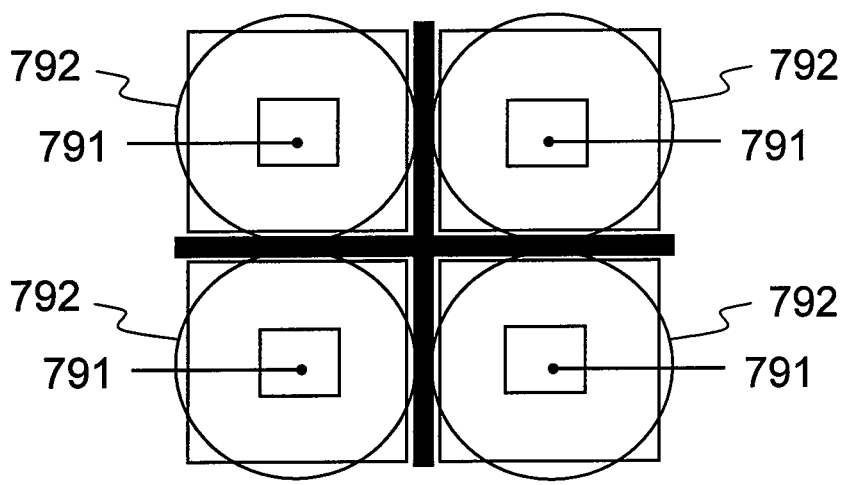
FIG. 7 shows a lens arrangement in accordance with an example embodiment of the invention.

FIG. 7 shows a lens arrangement in accordance with an example embodiment of the invention. It is typically desirable that the incident angle is low for example to avoid total reflection. Low incident angle can be achieved by using an appropriate lens arrangement. FIG. 7 shows a microlens array in which each pixel sensor 791 is covered by a respective microlens 792. The microlens 792 gathers the photons to the pixel cell. In this way an ultra thin microlens structure can be used instead of multi-lens structures. In an embodiment, the microlens is bigger than the channel area of the pixel cell. In that way there will be more space for graphene transistor circuits for each pixel, for example. If it is desirable to have the incident angle constant throughout the array of pixel sensors, a combination of the array of microlenses for each pixel sensor and an objective wide lens can be used.

Figure 8:
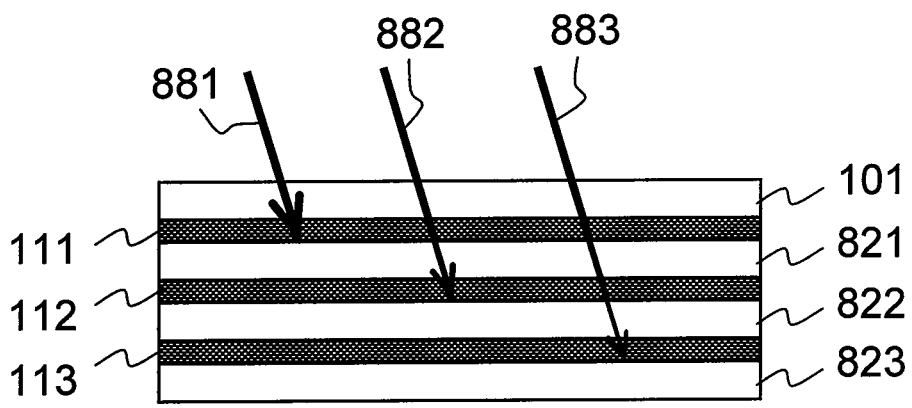
FIG. 8 shows a photon sensing structure in accordance with another example embodiment of the invention.

FIG. 8 shows a photon sensing structure in accordance with another example embodiment of the invention. The photon sensing structure of FIG. 8 otherwise corresponds to the photon sensing structure of FIG. 1 except that instead of substantially reflecting color components the intermediate layers between the photon sensing layers absorb the respective color component.

Accordingly, on the top the structure comprises the antireflective coating 101 for all color components. Below that layer the structure comprises the first sensing layer 111 made of graphene.

Below layer 111 the structure comprises an absorber layer 821 for a first color component (hereinafter referred to as the first absorber layer 821). The first absorber layer 821 passes other color components, but absorbs the first color component. In this embodiment, the first color component again is blue. Below the first absorber layer 821 the structure comprises a second sensing layer 112 made of graphene.

Below layer 112 the structure comprises an absorber layer 822 for a second color component (hereinafter referred to as the second absorber layer 822). The second absorber layer 822 passes other color components, but absorbs the second color component. In this embodiment, the second color component again is green. Below the second absorber layer 822 the structure comprises a third sensing layer 113 made of graphene.

Below layer 113 the structure optionally comprises an absorber layer 823 for a third color component (the third absorber layer 823). In this embodiment, the third color component again is red. It should be noted however, that the order of the color filters (layers 821-823) can be chosen to be different from the one presented above.

On the bottom, there is the layer 102 (not shown in FIG. 8) comprising amplifiers, logic, and wires to form a pixel structure. In an alternative embodiment, the logic etc. can be placed to the edges of the pixel cell. The materials used in absorber layers 821-823 depend on the implementation.

Just like in the foregoing embodiments, in the embodiment presented in FIG. 8, each graphene sheet typically absorbs around 2.3% of the incoming photons for each color component. The first absorber layer 821 absorbs from the incoming light 881 the wavelength range of the blue color component. The second absorber layer 822 absorbs from the incoming light 882 (from which the first absorber layer 821 has absorbed the blue color component already) the wavelength range of the green color component. And, the optional third absorber layer 823 absorbs from the incoming light 883 (from which the first and second absorber layers 821 and 822 have absorbed the blue and green color components already) the wavelength range of the red color component.

The number of graphene sheets in layers 111 and 112 in an example implementation is twelve, and the number of graphene sheets in layer 113 is twenty. The number of graphene sheets in each layer, however, can be varied to optimize the performance.

As to the photon sensing operation in the current embodiment, similarly as explained in connection with FIG. 1, practically all incoming photons (or incoming light) enter the first sensing layer 111. The blue color component is then practically obtained by subtracting signals obtained from the second and third sensing layers 112-113 from the signal obtained from the first sensing layer 111. Correspondingly, since all color components except the blue color component enter the second sensing layer 112, the green color component is obtained by subtracting the signal obtained from the third sensing layer 113 from the signal obtained from the second sensing layer 112. And, the red color component is directly obtained from the signal obtained from the third sensing layer 113.

And, in the event only a black and white picture is desired, the first sensing layer 111 can be used to obtain the black and white picture, in other words luminance information or similar without computing.

Furthermore, the concept can be used also in other frequencies such as infrared and ultraviolet.

Figure 9:
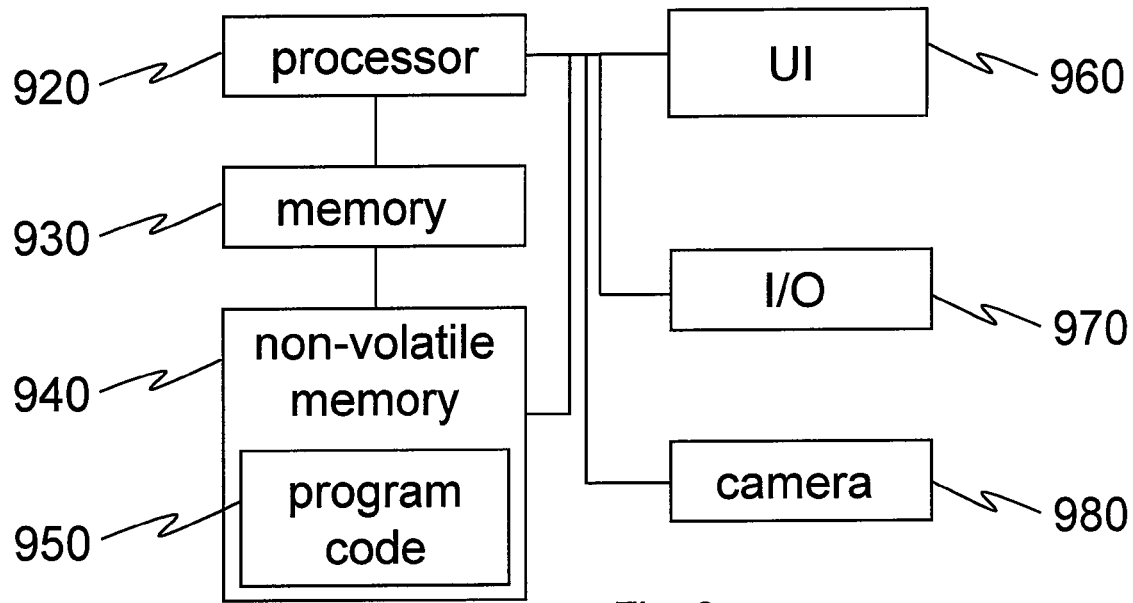
FIG. 9 shows an example block diagram of an apparatus according to an example embodiment of the invention.

FIG. 9 shows an example block diagram of an apparatus 900 according to an example embodiment of the invention.

The apparatus 900 comprises at least one non-volatile memory 940 configured to store computer programs or software comprising computer program code 950. The apparatus 900 further comprises at least one processor 920 for controlling the operation of the apparatus 900 using the computer program code 950, a work memory 930 for running the computer program code 950 by the at least one processor 920, and optionally an input/output system 970 for communicating with other entities or apparatuses. Accordingly, the input/output system 970, if present, comprises one or more communication units or modules providing communication interfaces towards a communication network and/or towards another apparatus. The apparatus 900 comprises a user interface 960 enabling a user to use the device.

The apparatus 980 further comprises a camera module 980. The camera module 980 comprises the photon sensing structure described in the example embodiments. The camera module 980 is connected to the at least one processor 920. It may be controlled by the at least one processor 920. Instead or in addition, the camera module 980 may comprise its own processor controlling its operation or the operation of the whole apparatus 900. Depending on whether the apparatus is a mobile communication device housing a camera, or, for example, a mere digital camera, the structure of the apparatus may deviate from that presented in FIG. 9. One or more of the blocks may be omitted and/or one or more additional blocks may be added in an actual implementation.

Figure 10:
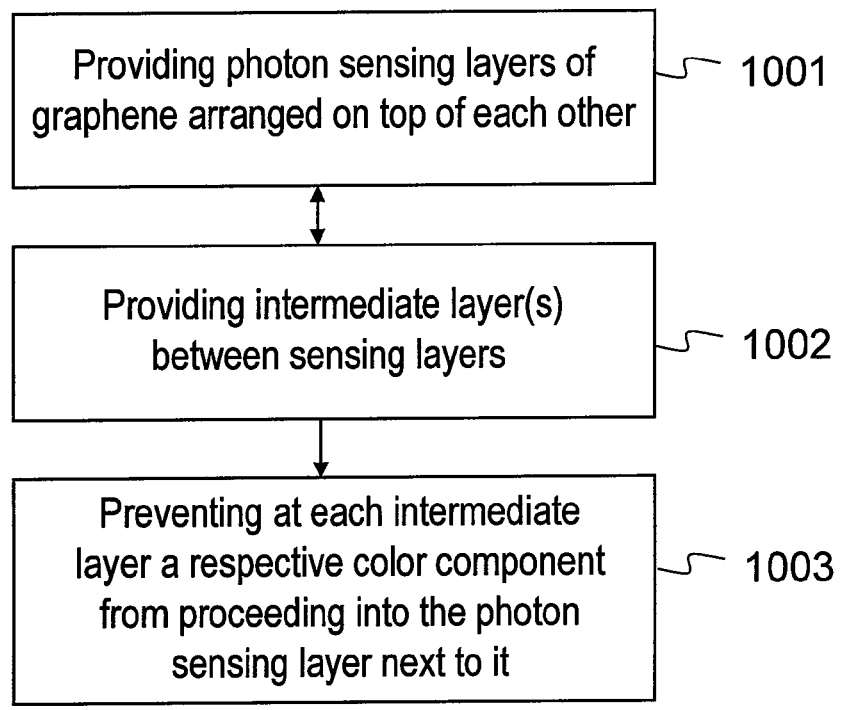
FIG. 10 shows a rough flow diagram showing a method in accordance with an example embodiment of the invention.

FIG. 10 is a flow diagram showing a method in accordance with an example embodiment of the invention. In the first steps (steps 1001 and 1002), the method comprises providing a plurality of photon sensing layers and intermediate layer(s) arranged on top of each other, where the photon sensing layers are of graphene. The steps 1001 and 1002 do not necessarily reflect any temporal order between the steps. In reality, when the structure, for example, is being fabricated the steps 1001 and 1002 can be alternately repeated so that a stack is produced in which photon sensing layers and intermediate layer(s) alternate. The resulting structure is such that each intermediate layer prevents a respective color component from proceeding into the photon sensing layer next to it (step 1003). An intermediate layer may prevent a color component from proceeding by absorbing the color component, or by reflecting it.

Other Embodiments

In an example embodiment, the zero-bias operation described in the foregoing can be enhanced by doping the channel between electrodes to be partly n-type and partly p-type. Also the metal contacts can be chosen so that the doping effect is enhanced, that is, by choosing different metals to source and drain electrodes, with different work functions.

In an example embodiment, signals or data obtained from the pixel cells can be compressed using any suitable compression algorithm immediately before sending it further. For example, only differences compared to neighboring cell values can be stored.

In an example embodiment, a correlated double sampling technique is used. For that purpose, a measuring (or transfer) transistor may be added to every pixel cell.

In an example embodiment, the amplifiers can be implemented by using graphene transistors or traditional CMOS technology similar as in backside illuminated CMOS sensors.

Without in any way limiting the scope, interpretation, or application of the claims appearing below, certain technical effects of one or more of the example embodiments disclosed herein are listed in the following: A technical effect is a single pixel solution instead of having parallel separate pixels for sensing different wavelength bands. When only one pixel is needed for color separation, a technical effect is improved color separation compared to certain other sensors. Another technical effect is fairly even absorption of photons in the whole visible light spectrum. Yet another technical effect is a simple sensor structure to fabricate, as well as low material costs for graphene and intermediate layers. Yet another technical effect is that graphene is a flexible material providing certain design advantages. Yet another technical effect is a fast photoresponse. Fast response time can decrease power consumption, and give more time to processing the data.

The foregoing description has provided by way of non-limiting examples of particular implementations and embodiments of the invention a full and informative description of the best mode presently contemplated by the inventors for carrying out the invention. It is however clear to a person skilled in the art that the invention is not restricted to details of the embodiments presented above, but that it can be implemented in other embodiments using equivalent means or in different combinations of embodiments without deviating from the characteristics of the invention.

If desired, the different functions discussed herein may be performed in a different order and/or concurrently with each other. Furthermore, if desired, one or more of the above-described functions may be optional.

Furthermore, some of the features of the above-disclosed embodiments of this invention may be used to advantage without the corresponding use of other features. As such, the foregoing description shall be considered as merely illustrative of the principles of the present invention, and not in limitation thereof. Hence, the scope of the invention is only restricted by the appended patent claims.

The invention claimed is:

1. An apparatus, comprising:
   a plurality of photon sensing layers arranged on top of each other; and
   an intermediate layer between each two adjacent sensing layers, the sensing layers being of graphene, and each intermediate layer being configured to prevent a respective color component of light from proceeding into the photon sensing layer next to it; wherein
   at least one of the plurality of photon sensing layers comprises a plurality of graphene sub-layers; the apparatus further comprising
   two source electrodes and a drain electrode connected to each photon sensing layer.

2. An apparatus according to claim 1, comprising each said intermediate layer configured to prevent a predetermined color component from proceeding via reflection of the color component.

3. An apparatus according to claim 1, comprising each said intermediate layer configured to prevent a predetermined color component from proceeding via absorption of the color component.

4. An apparatus according to claim 1, wherein the apparatus is selected from the group consisting of: an image sensor for a black and white image system, and an image sensor of a color image system.

5. An apparatus according to claim 4, wherein the color image system comprises an RGB-coded system.

6. An apparatus according to claim 1, comprising the following layers on top of each other in the following order:
   a sensing layer for a first color, a reflective layer or an absorbing layer for the first color, a sensing layer for a second color, a reflective layer or an absorbing layer for the second color, and a sensing layer for a third color.

7. An apparatus according to claim 6, wherein the first color is blue, the second color is green, and the third color is red.

8. An apparatus according to claim 1, wherein a sensor pixel is covered by a respective microlens.

9. An apparatus according to claim 1, wherein the apparatus is a handheld mobile communication device.

10. A method, comprising:
    providing a plurality of photon sensing layers arranged on top of each other; and an intermediate layer between each two adjacent sensing layers, the sensing layers being of graphene;
    preventing by each intermediate layer a respective color component of light from proceeding into the photon sensing layer next to it;
    providing at least one of the plurality of photon sensing layers with a plurality of graphene sub-layers; and
    providing two source electrodes and a drain electrode connected to each photon sensing layer.

11. A method according to claim 10, comprising:
    preventing by each intermediate layer a respective color component from proceeding into the photon sensing layer next to it via reflecting the color component.

12. A method according to claim 10, comprising:
    preventing by each intermediate layer a respective color component from proceeding into the photon sensing layer next to it via absorbing the color component.

13. A method according to claim 10, comprising:
    providing an apparatus for sensing color components in the apparatus, the apparatus being selected from the group consisting of: an image sensor for a black and white image system, and an image sensor of a color image system.

14. A method according to claim 13, wherein the color image system comprises an RGB-coded system.

15. A method according to claim 10, comprising:
    manufacturing said photon sensing layers and each said intermediate layer by a manufacturing method which is selected from a group consisting of: an atomic layer deposition method, a chemical vapor deposition method, a spin coating method, and an RF sputtering method.

16. A method according to claim 10, comprising:
    manufacturing a stacked structure comprising layers on top of each other, where the layers are in the following order:
    a sensing layer for a first color, a reflective layer or an absorbing layer for the first color, a sensing layer for a second color, a reflective layer or an absorbing layer for the second color, and a sensing layer for a third color.

17. A method according to claim 16, wherein the first color is blue, the second color is green, and the third color is red.

18. A method according to claim 10, comprising:
    covering a sensor pixel by a respective microlens.

* * * * *